(12) United States Patent
Chen

(10) Patent No.: US 10,797,126 B2
(45) Date of Patent: Oct. 6, 2020

(54) DISPLAY DEVICE AND MANUFACTURING METHOD THEREOF, DISPLAY PANEL

(71) Applicant: Wuhan China Star Optoelectronics Semiconductor Display Technology Co., Ltd., Wuhan (CN)

(72) Inventor: Ji-Feng Chen, Shenzhen (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 34 days.

(21) Appl. No.: 16/109,803

(22) Filed: Aug. 23, 2018

(65) Prior Publication Data

US 2019/0237531 A1  Aug. 1, 2019

Related U.S. Application Data

(63) Continuation of application No. PCT/CN2018/092108, filed on Jun. 21, 2018.

(30) Foreign Application Priority Data

Jan. 29, 2018 (CN) .......................... 2018 1 0083305

(51) Int. Cl.
*H01L 27/32* (2006.01)
*H01L 51/00* (2006.01)
*H01L 51/56* (2006.01)
*G01B 7/16* (2006.01)

(52) U.S. Cl.
CPC ............ *H01L 27/3276* (2013.01); *G01B 7/20* (2013.01); *H01L 51/003* (2013.01); *H01L 51/0097* (2013.01); *H01L 51/56* (2013.01); *H01L 27/3244* (2013.01); *H01L 2227/323* (2013.01); *H01L 2227/326* (2013.01); *H01L 2251/5338* (2013.01)

(58) Field of Classification Search
CPC ......... H01L 2227/323; H01L 2227/326; H01L 2251/5338; H01L 27/3244; H01L 27/3276; H01L 51/003; H01L 51/0097; H01L 51/56
USPC .......................................... 257/40
See application file for complete search history.

(56) References Cited

U.S. PATENT DOCUMENTS

| | | |
|---|---|---|
| 2008/0043194 A1 | 2/2008 | Lin et al. |
| 2011/0227178 A1 | 9/2011 | Kazama et al. |
| 2011/0255250 A1* | 10/2011 | Dinh ...................... G03B 15/03 361/749 |
| 2015/0162387 A1 | 6/2015 | Gu et al. |
| 2015/0181772 A1* | 6/2015 | Ady ..................... H05K 9/0022 361/752 |
| 2016/0293884 A1 | 10/2016 | Zhang et al. |

(Continued)

FOREIGN PATENT DOCUMENTS

CN  107479757 A  12/2017

*Primary Examiner* — Duy T Nguyen

(57) ABSTRACT

The present disclosure provides a display device and a manufacturing method thereof, and a display panel. The display panel may include a substrate defining a through hole; a driving wiring carried on the substrate; a solder pad being arranged on a back surface of the substrate. A first end of the driving wiring is located on a front surface of the substrate, and a second end of the driving wiring is connected to the solder pad via the through hole.

11 Claims, 6 Drawing Sheets

(56) References Cited

U.S. PATENT DOCUMENTS

2017/0170108 A1* 6/2017 Wong ............... H01L 23/49838
2017/0329472 A1* 11/2017 Kim ..................... G06F 3/0481

* cited by examiner

DISPLAY DEVICE AND MANUFACTURING METHOD THEREOF, DISPLAY PANEL

CROSS-REFERENCE TO RELATED APPLICATIONS

The present application is a continuation-application of International (PCT) Patent Application No. PCT/CN2018/092108, filed on Jun. 21, 2018, which claims foreign priority of Chinese Patent Application No. 201810083305.1, filed on Jan. 29, 2018 in the State Intellectual Property Office of China, the entire contents of which are hereby incorporated by reference.

FIELD

The described embodiments relate to a display technology, and more particularly, to a display device and a manufacturing method thereof, and a display panel.

BACKGROUND

Referring to FIG. 1, FIG. 1 is a schematic layout of a wiring in accordance with an embodiment in the related art. As shown in FIG. 1, a display panel 10 includes an active area 11 and an upper frame portion 121, a lower frame portion 122, a left frame portion 123, and a right frame portion 124. The active area 11, the upper frame portion 121, the lower frame portion 122, the left frame portion 123, and the right frame portion 124 are arranged around the active area 11. The four frame portions may be used as a non-active area to arrange a driving wiring 13, and one end of the driving wiring 13 is connected to a thin film transistor (TFT) in the active area 11. The other end of the driving wiring 13 is finally connected to a wire bonding area in the lower frame portion 122 via the non-active area. Driving signals are applied to a solder pad in the wire bonding area 14, so that the display panel 10 may display.

In order to achieve a higher screen ratio and improve the appearance quality of the product, it has become an industry trend to design a borderless and bezel free for the display device using the above-mentioned display panel 10. For this trend, some of the driving wiring 13 may be hidden behind the active area 11, but it is difficult to meet high resolution (high pixels per inch) design requirements. Here, the industry also offers the following two borderless designs.

FIG. 2 is a structural illustration in a cross-sectional view of a display panel adopting a borderless design in accordance with an embodiment in the related art. Referring to FIG. 1 and FIG. 2, for a display device 20 designed by using a flexible printed circuit, a flexible printed circuit 21 is bent in 180 degrees and connected to the driving wiring of the display panel 10, and the driving wiring including a driving integrated circuit (IC) 211 is arranged on the back side of the flexible printed circuit 21, i.e., the driving wiring and the driving integrated circuit are hide behind the display panel 10. However, the flexible printed circuit 21 has a certain degree of rigidity, and a stress generated by the bending thereof may affect the connection with the driving wiring 13. It may cause the driving signal to be unable to be transmitted to the display panel 10. In order to avoid the above-mentioned problem, a bent portion of the flexible printed circuit 21 must have a predetermined size, i.e., a distance d1 from a bent outermost edge thereof to a bonding portion of the display panel 10 must be greater than a certain value. It is unfavorable to reduce a size of the lower frame 122.

FIG. 3 is a structural illustration in a cross-sectional view of a display panel adopting a borderless design in accordance with another embodiment in the related art. Referring to FIG. 1 to FIG. 3, for a display device 30 designed by using a flexible display 11, a circuit board 31 is arranged on the back side of the display panel 10, and the display panel 10 is bent in 180 degrees and connected to the circuit board 31. Although this design may reduce a distance of the bending portion d2, its function is very limited. It may cause the driving wiring 13 mainly composed of a metal material to be broken, which may also cause the driving signal is not transmitted to the display panel 10.

So that the existing borderless and bezel free designs still need to be improved.

SUMMARY

The present disclosure provides a display device and a manufacturing method thereof, and a display panel. The borderless and bezel free designs may be improved.

In order to solve the above-mentioned technical problem, a technical solution adopted by the present disclosure is to provide a display panel including: a substrate defining a through hole; a driving wiring carried on the substrate; a solder pad being arranged on a back surface of the substrate; wherein a first end of the driving wiring is located on a front surface of the substrate, and a second end of the driving wiring is connected to the solder pad via the through hole.

In order to solve the above-mentioned technical problem, a technical solution adopted by the present disclosure is to provide a display device including a circuit board and a display panel; the display panel including: a substrate defining a through hole; a driving wiring carried on the substrate; a solder pad being arranged on a back surface of the substrate; wherein a first end of the driving wiring is located on a front surface of the substrate, and a second end of the driving wiring is connected to the solder pad via the through hole; wherein the circuit board is connected to the solder pad of the display panel.

In order to solve the above-mentioned technical problem, a technical solution adopted by the present disclosure is to provide a manufacturing method for a display device including: providing a base substrate; forming a first conductive pattern on the base substrate; forming a substrate defining a through hole, and the substrate covering the first conductive pattern on the base substrate; and the through hole being configured to expose the first conductive pattern; forming a second conductive pattern on the substrate, and the second conductive pattern filling the through hole to connect to the first conductive pattern; forming a thin-film transistor on the second conductive pattern, and the thin-film transistor being connected to the second conductive pattern; forming a light emitting unit connected to the thin-film transistor; separating the substrate from the base substrate; arranged a circuit board on a surface of the substrate opposite to the second conductive pattern, and the circuit board being connected to the first conductive pattern.

Advantages of the disclosure may follow. As compared with the related art, the present disclosure may provide a through hole opened on a substrate, and a driving wiring is guided to be connected a back surface of the substrate via the through hole, i.e., a wiring bonding portion may be arranged on the back surface of the substrate, instead of a non-active area of the display panel. So that the borderless and bezel free designs may be improved.

DETAILED DESCRIPTION

The detailed description set forth below is intended as a description of the subject technology with reference to the appended figures and embodiments. It is understood that the embodiments described herein include merely some parts of the embodiments of the present disclosure, but do not include all the embodiments. Based on the embodiments of the present disclosure, all other embodiments that those skilled in the art may derive from these embodiments are within the scope of the present disclosure.

Figure 1:
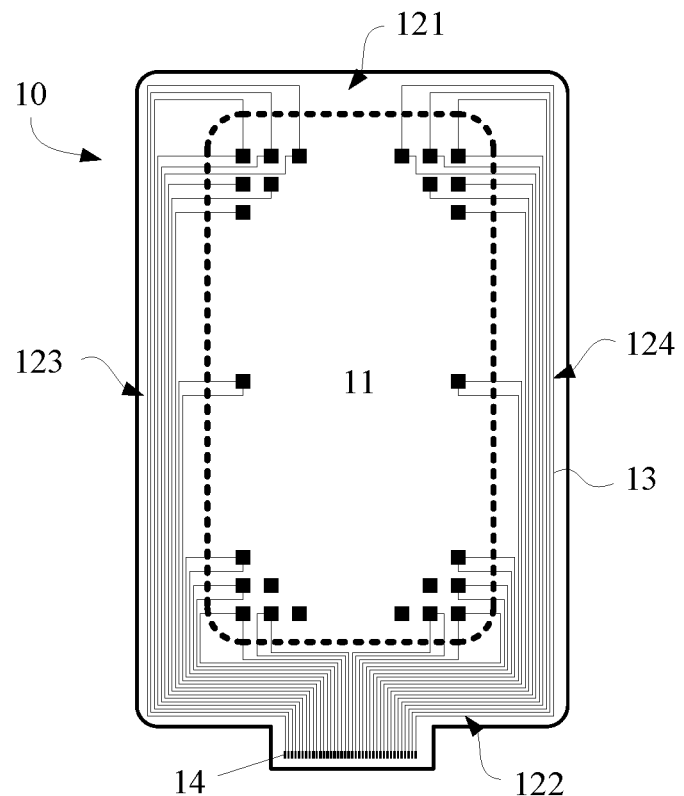
FIG. 1 is a schematic illustration of a wiring layout in accordance with an embodiment in the related art.
Figure 2:
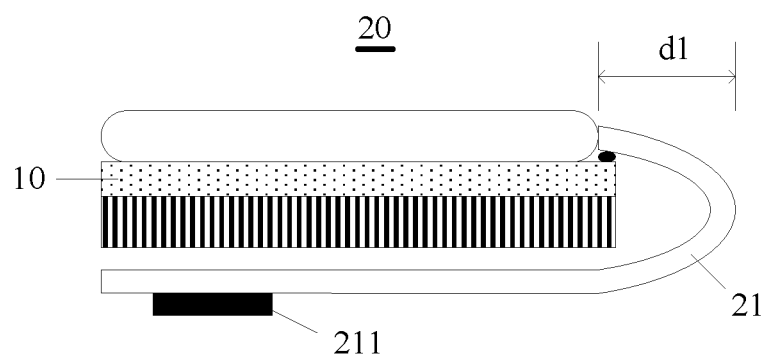
FIG. 2 is a structural illustration in a cross-sectional view of a display panel adopting a borderless design in accordance with an embodiment in the related art.
Figure 3:
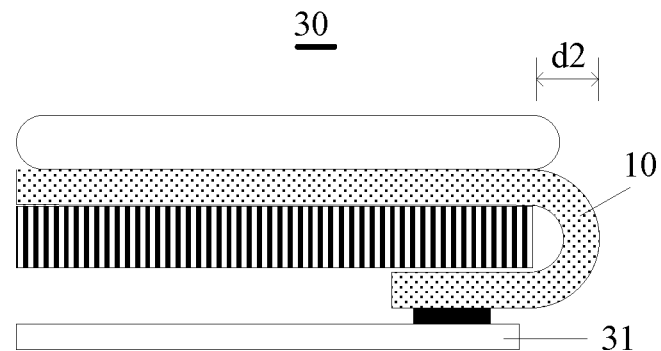
FIG. 3 is a structural illustration in a cross-sectional view of a display panel adopting a borderless design in accordance with another embodiment in the related art.
Figure 4:
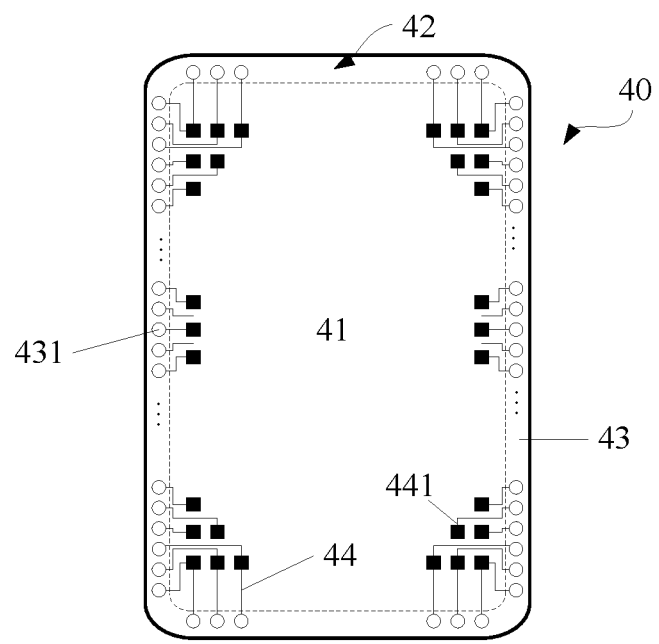
FIG. 4 is a structural illustration of a wiring layout on a front side of a display panel in accordance with an embodiment in the present disclosure.
Figure 5:
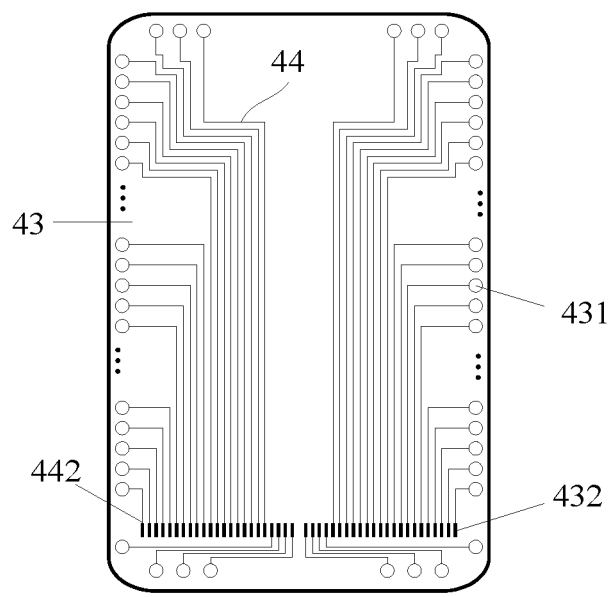
FIG. 5 is a structural illustration of a wiring layout on a back side of a display panel in accordance with an embodiment in the present disclosure.

FIG. 4 is a structural illustration of a wiring layout on a front side of a display panel in accordance with an embodiment in the present disclosure, and FIG. 5 is a structural illustration of a wiring layout on a back side of a display panel in accordance with an embodiment in the present disclosure. As shown in FIG. 4 and FIG. 5, a front side of the display panel 40 may be divided into an active area 41 (an area defined inside a dotted line in FIG. 4) and a non-active area 42 arranged around the active area 41. The display panel 40 may include a substrate 43 arranged on a back side of the display panel 40. A thin film transistor, a light-emitting component, and other structures may be arranged on the substrate 43 and between the display panel 40 and the substrate 43. The thin film transistor, the light-emitting component, and other the structures may receive driving signals from a driving wiring 44 carried on the substrate 43, so that the display panel 40 may display.

In the non-active area 42, the substrate 43 may define a plurality of through holes 431, and the plurality of through holes 431 may be arranged around the active area 41. A solder pad 432 may be arranged on a back surface of the substrate 43. A first end 441 of the driving wiring 44 may be located on a front surface of the substrate 41, and a second end 442 of the driving wiring 44 may be connected to the solder pad 432 via the through hole 431, i.e., the driving wiring 44 may be passed out the through 431 and may be guided to the back surface of the substrate 43.

Figure 6:
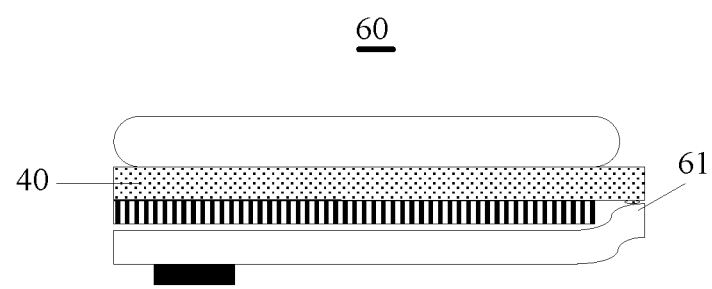
FIG. 6 is a structural illustration in a cross-sectional view of a display panel in accordance with an embodiment in the present disclosure.

As shown in FIG. 6, when the display panel 40 and a circuit board 61 may be assembled to form a display device 60, and the circuit board 61 may be arranged on the back surface of the substrate 43, and may be connected to the solder pad 432. The solder pad 432 may be located on the back surface of the substrate 43, i.e., a wiring bonding portion may be arranged on the back side of the display panel 40 instead of being arranged in the non-active area 42. The driving wirings 44 may be directly arranged the back side of the display panel 40 via the through holes 431, and the non-active area 42 may not need to reserve an arrangement space for the driving wirings 44, so that the borderless and bezel free design of display device 60 may be improved. Moreover, the circuit board 61 and the driving wirings 44 may be bonded on the back surface of the substrate 43, and the circuit board 61 may be originally arranged on the back surface of the substrate 43, so that it may not necessary to bend the circuit board 61 or the substrate 43, and it may be avoid a fracture occurring in the driving wiring 44. In addition, because an area of the back surface of the substrate 43 may be large, a size of the solder pad 432 may be designed to be large enough, and a distance between the adjacent solder pads 432 may also be increased, so that a problem that the driving circuit and the solder pad 432 are misaligned due to shrinkage or expansion of the substrate 43, may be avoided.

In the present embodiment, the display device 60 may be a flexible active-matrix organic light emitting diode (AMOLED) display device. The display panel 40 may be a flexible display, and the substrate 43 may be a bendable flexible substrate made of a material of the substrate is polyimide (PI).

Figure 7:
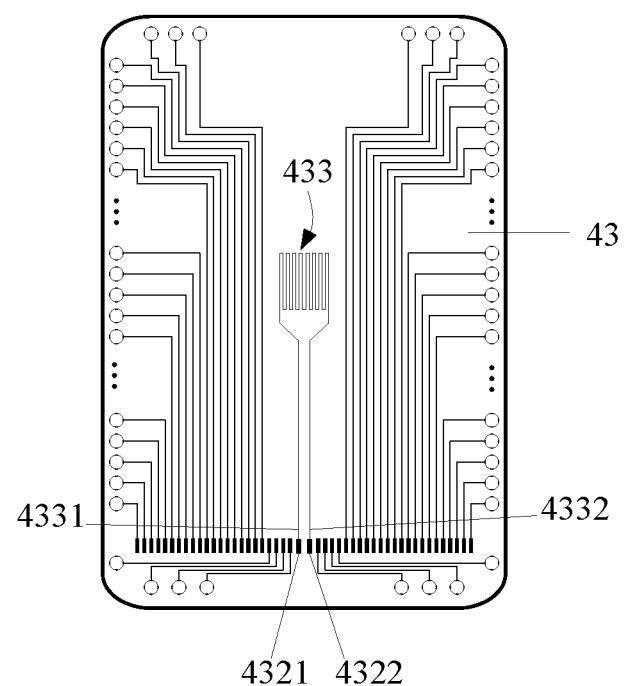
FIG. 7 is a structural illustration of a wiring layout on a back side of a display panel in accordance with another embodiment in the present disclosure.

FIG. 7 is a structural illustration of a wiring layout on a back side of a display panel in accordance with another embodiment in the present disclosure. As shown in FIG. 6 and FIG. 7, the display device 60 may further include a strain sensor 433 arranged on the back surface of the substrate 43. The strain sensor 433 may be configured to detect a stress deformation parameter of the driving wiring 44.

The strain sensor 433 may adopt a conductive wiring arranged in a serpentine route manner. The conductive wiring may include a third end 4331 and a fourth end 4332; and the solder pad 432 may include a first solder pad 4321 and a second solder pad 4322. The third end 4331 of the conductive wiring may be connected to the first solder pad 4321, and the fourth end 4332 of the conductive wiring may be connected to the second solder pad 422. A material of the conductive wiring may be metal, when the conductive wiring is stressed, a length of the conductive wiring may be changed, and a resistance value of the conductive wiring may be also changed. As long as the resistance value of the conductive wiring is measured, a deformation of the display panel 40 may be determined in time.

Figure 8:
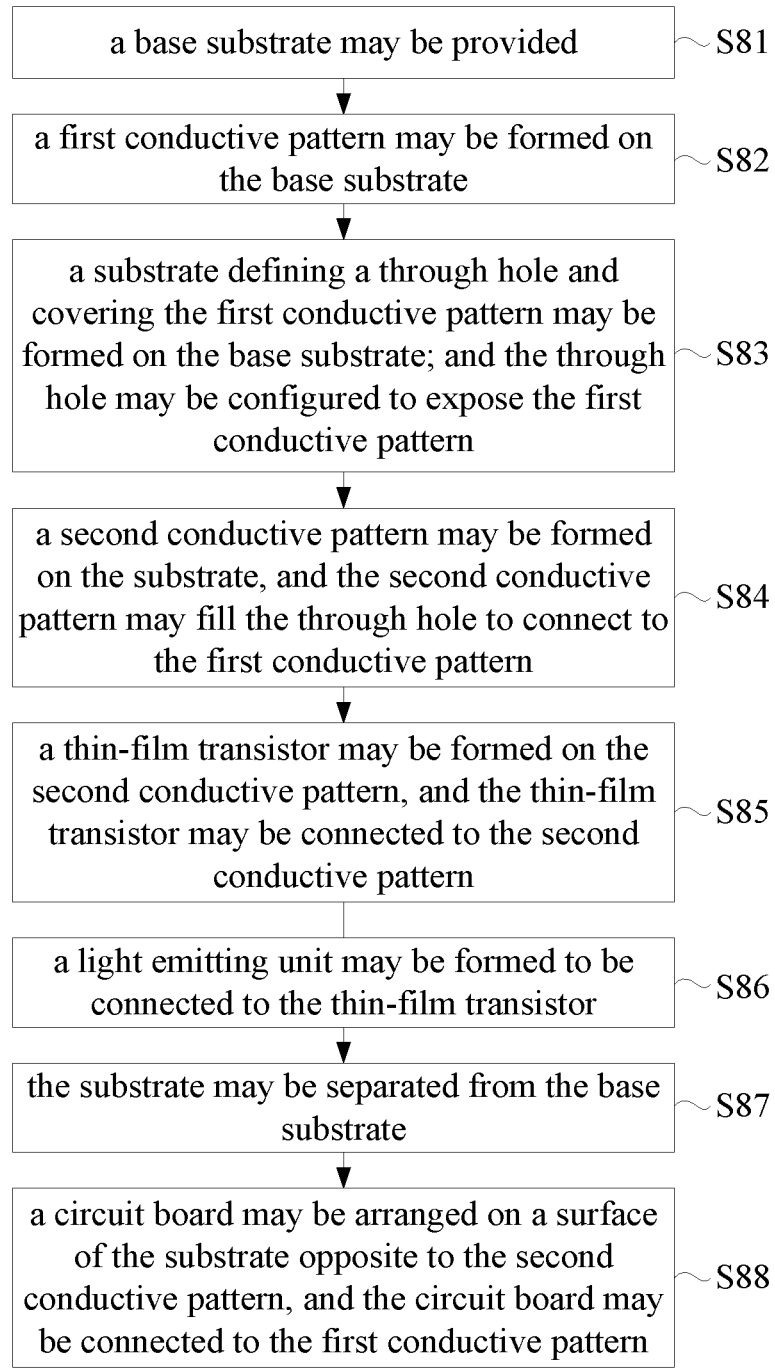
FIG. 8 is a flow chart of a manufacturing method for a display device in accordance with an embodiment in the present disclosure.
Figure 9:
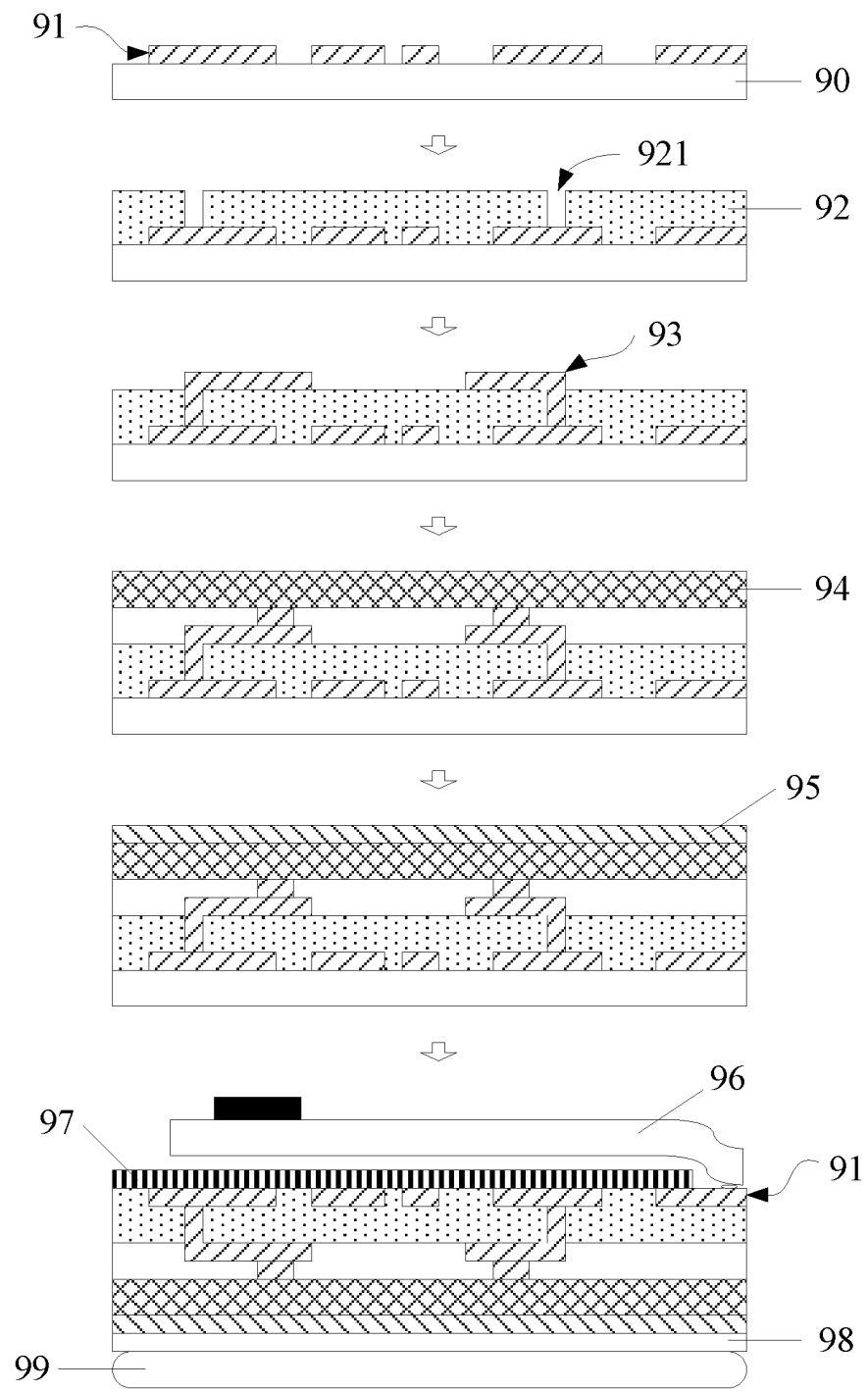
FIG. 9 is a schematic illustration of manufacturing scenes of a manufacturing method for a display device based on the method in FIG. 8.

The present disclosure also provides a manufacturing method for a display device in accordance with an embodiment. Referring to FIG. 8 and FIG. 9, the manufacturing method for the display device may include blocks S81 to S88.

S81: a base substrate may be provided.

A base substrate 90 may be a light transmissive substrate such as a glass substrate, a plastic substrate, and a flexible substrate.

S82: a first conductive pattern may be formed on the base substrate.

In the present embodiment, a whole surface metal layer covering the base substrate 90 may be formed by a physical vapor deposition (PVD) process. A material of the metal layer may be metal, such as molybdenum (Mo), titanium (Ti), aluminum (Al), and silver (Ag). Then, a first conductive pattern 91 may be formed by etching the metal layer by a patterning process.

S83: a substrate defining a through hole and covering the first conductive pattern may be formed on the base substrate, and the through hole may be configured to expose the first conductive pattern.

In the present embodiment, a PI layer may be coated on the base substrate 90 by a chemical vapor deposition (CVD) process, and a substrate 92 may be formed by baking the PI layer. The substrate 92 may be a flexible structure covering a whole surface of the base substrate 90, and the substrate 92 may have a uniform thickness. The substrate 92 may completely cover the base substrate 90 and the first conductive pattern 91, simultaneously. In the present embodiment, a through hole 921 may be defined on a predetermined position above the first conductive pattern 91 by any one of methods of laser drilling, dry etching, or chemical etching.

In an application scenario in which the through hole 921 is formed by an etching process, in the present embodiment, the etching process may be regarded as a selective etching process, i.e., etching solution or etching gas may only react with the PI layer on the substrate 92. In the etching process, when the substrate 92 is completely penetrated to reach the first conductive pattern 91, the etching process may be stopped.

S84: a second conductive pattern may be formed on the substrate, and the second conductive pattern may fill the through hole to connect to the first conductive pattern.

A material of a second conductive pattern 93 and a material of the first conductive pattern 91 may be same, and a forming process of the second conductive pattern 93 and a forming process of the first conductive pattern 91 may be same. The second conductive pattern 93 may further fill the through hole 921 to connect the first conductive pattern 91, so that an upper and a lower sides of the substrate 92 may be electrically connected.

S85: a thin-film transistor may be formed on the second conductive pattern, and the thin-film transistor may be connected to the second conductive pattern.

Structures and processes of the TFT may be referred to the related art. A source, a drain, and a gate of the TFT may be both connected to the second conductive pattern 93. In the present embodiment, a through hole may be defined on a predetermined position of a structural layer 94 by etching, and the structural layer 94 is where the TFT is located. Then, a metal depositing process and a patterning process may be performed in the through hole, so that a driving wiring located on a front surface of the substrate 92 may be guided to a back surface of the substrate 92.

S86: a light emitting unit may be formed to be connected to the thin-film transistor.

In the present embodiment, a light emitting unit 95 may be formed by an evaporation process.

S87: the substrate may be separated from the base substrate.

In the present embodiment, before the block S82, fluoroalkyl silanes (FAS) may be coated on the base substrate 90, to be a peeling film. A mechanical de-bonding method may be adopted to separate the substrate 92 from the base substrate 90. Further, after the substrate 92 is separated from the base substrate 90, because of the peeling film, the first conductive pattern 91 may attach to the substrate 92 without remaining on the base substrate 90.

S88: a circuit board may be arranged on a surface of the substrate opposite to the second conductive pattern, and the circuit board may be connected to the first conductive pattern.

The substrate 92 may be flipped by 180 degrees, and the circuit board 96 may be soldered to the first conductive pattern 91 on a back surface of the substrate 92. Then, a back plate 97, a polarizer 98 and a cover window 99 may be assembled, to obtain the display device.

In the present embodiment, the first conductive pattern 91 may correspond to a portion of the driving wiring 44 located on the back surface of the substrate 43 shown in FIG. 5; the through hole 921 may correspond to the through hole 431 shown in FIG. 5 and FIG. 6; the second conductive pattern 93 may correspond to a portion where the driving wiring 44 is connected to the active area 41 via the through hole 431 shown in FIG. 4. In the present embodiment, because the manufacturing method may produce a display device having a same structure as that of the above-mentioned display device 60, the above-mentioned characteristics may be also obtained.

It is understood that the descriptions above are only embodiments of the present disclosure. It is not intended to limit the scope of the present disclosure. Any equivalent transformation in structure and/or in scheme referring to the instruction and the accompanying drawings of the present disclosure, and direct or indirect application in other related technical field, are included within the scope of the present disclosure.

What is claimed is:

1. A display panel comprising:
  a substrate defining a through hole;
  a driving wiring carried on the substrate;
  a solder pad being arranged on a back surface of the substrate;
  an active area; and
  a non-active area around the active area;
  wherein a first end of the driving wiring is located on a front surface of the substrate, and a second end of the driving wiring is connected to the solder pad via the through hole;
  wherein the through hole is located in the non-active area;
  wherein the substrate is a bendable flexible substrate;
  a strain sensor, wherein the strain sensor is arranged on the back surface of the substrate and in the active area, and is configured to detect a stress deformation parameter of the driving wiring.

2. The display panel according to claim 1, wherein a material of the substrate is polyimide (PI).

3. The display panel according to claim 1, wherein the strain sensor comprises a conductive wiring arranged in a serpentine route manner, and the conductive wiring comprises a third end and a fourth end; the solder pad comprise a first solder pad and a second solder pad, wherein the third end of the conductive wiring is connected to the first solder pad, and the fourth end of the conductive wiring is connected to the second solder pad.

4. The display panel according to claim 1, wherein
  the through hole defined on the substrate comprises a first through hole on a first side of the substrate and a second through hole on a second side adjacent to the first side;
  the driving wiring carried on the substrate comprises a first driving wiring and a second driving wiring;
  the solder pad being arranged on the back surface of the substrate comprises a third solder pad and a fourth solder pad;

wherein a fifth end of the first driving wiring is located on the front surface of the substrate, and a sixth end of the first driving wiring is connected to the third solder pad via the first through hole; a seventh end of the second driving wiring is located on the front surface of the substrate, and a eighth end of the second driving wiring is connected to the fourth solder pad via the second through hole; the first through hole and the second through hole are located in the non-active area and around the active area; and the third solder pad and the fourth solder pad are located on a same side of the substrate.

5. The display panel according to claim 4, wherein
the through hole defined on the substrate further comprises a third through hole on a third side opposite to the first side;
the driving wiring carried on the substrate further comprises a third driving wiring;
the solder pad being arranged on the back surface of the substrate further comprises a fifth solder pad located on the same side where the third solder pad and the fourth solder pad are arranged on;
the first side and the third are parallel to the side where the third solder pad, the fourth solder pad, and the fifth solder pad are arranged on;
the sixth end of the first driving wiring is connected to the third solder pad via the first through hole along a first direction; and a ninth end of the third driving wiring is connected to the fifth solder pad via the third through hole along a third direction opposite to the first direction.

6. The display panel according to claim 1, wherein the first end is located in the active area and the second end is located in the non-active area.

7. A display device comprising a circuit board and a display panel; the display panel comprising:

a substrate defining a through hole;
a driving wiring carried on the substrate;
a solder pad being arranged on a back surface of the substrate;
an active area; and
a non-active area around the active area;
wherein a first end of the driving wiring is located on a front surface of the substrate, and a second end of the driving wiring is connected to the solder pad via the through hole;
wherein the circuit board is connected to the solder pad of the display panel;
wherein the through hole is located in the non-active area;
wherein the substrate is a bendable flexible substrate;
a strain sensor, wherein the strain sensor is arranged on the back surface of the substrate and in the active area, and is configured to detect a stress deformation parameter of the driving wiring.

8. The display device according to claim 7, wherein a material of the substrate is polyimide (PI).

9. The display device according to claim 7, wherein the strain sensor comprises a conductive wiring arranged in a serpentine route manner, and the conductive wiring comprises a third end and a fourth end; the solder pad comprise a first solder pad and a second solder pad, wherein the third end of the conductive wiring is connected to the first solder pad, and the fourth end of the conductive wiring is connected to the second solder pad.

10. The display device according to claim 7, wherein the circuit board is a flexible circuit board.

11. The display device according to claim 7, wherein the display device is a flexible active matrix light emitting diode (AMOLED) display device.

* * * * *